(12) United States Patent
Cheng et al.

(10) Patent No.: US 9,611,546 B2
(45) Date of Patent: Apr. 4, 2017

(54) SOLID PRECURSOR DELIVERY SYSTEM

(71) Applicant: TAIWAN SEMICONDUCTOR MANUFACTURING CO., LTD., Hsinchu (TW)

(72) Inventors: Chung-Liang Cheng, Changhua (TW); Chien-Hao Tseng, Taichung (TW); Yen-Yu Chen, Taichung (TW); Ching-Chia Wu, Taichung (TW); Chang-Sheng Lee, Shin-Chu (TW); Wei Zhang, Chupei (TW)

(73) Assignee: TAIWAN SEMICONDUCTOR MANUFACTURING CO., LTD., Hsinchu (TW)

( * ) Notice: Subject to any disclaimer, the term of this patent is extended or adjusted under 35 U.S.C. 154(b) by 0 days.

(21) Appl. No.: 15/099,687

(22) Filed: Apr. 15, 2016

(65) Prior Publication Data
US 2016/0230275 A1    Aug. 11, 2016

Related U.S. Application Data

(62) Division of application No. 14/092,362, filed on Nov. 27, 2013, now Pat. No. 9,343,315.

(51) Int. Cl.
*H01L 21/469* (2006.01)
*C23C 16/44* (2006.01)
*H01L 21/28* (2006.01)
*C23C 16/448* (2006.01)
(Continued)

(52) U.S. Cl.
CPC ...... *C23C 16/4402* (2013.01); *C23C 16/4481* (2013.01); *C23C 16/4485* (2013.01); *C23C 16/45544* (2013.01); *C23C 16/45553* (2013.01); *H01L 21/28158* (2013.01); *H01L 21/28167* (2013.01); *H01L 21/28185* (2013.01); *H01L 29/517* (2013.01)

(58) Field of Classification Search
CPC ......... H01L 21/28158; H01L 21/28194; C23C 16/4402; C23C 16/448
USPC .................................................. 438/778–779
See application file for complete search history.

(56) References Cited

U.S. PATENT DOCUMENTS

| | | | |
|---|---|---|---|
| 6,921,062 B2 * | 7/2005 | Gregg | C23C 16/4481 118/726 |
| 7,109,113 B2 * | 9/2006 | Derderian | C23C 16/4481 118/715 |

(Continued)

OTHER PUBLICATIONS

Notice of Allowance U.S. Appl. No. 14/092,362 dated Jan. 15, 2016.

*Primary Examiner* — Benjamin Sandvik
*Assistant Examiner* — Herve Assouman
(74) *Attorney, Agent, or Firm* — McDermott Will & Emery LLP

(57) ABSTRACT

A method for fabricating a semiconductor structure and a solid precursor delivery system for a semiconductor fabrication is provided, the method including: providing a solid precursor having a first average particle size; solving the solid precursor in an organic solvent into an intermediate; recrystallizing the intermediate to form solid granules, wherein the solid granules has a second average particle size larger than the first average particle size; vaporizing the solid granules to form a film-forming gas; and depositing the film-forming gas on a substrate to form a resistance film.

20 Claims, 4 Drawing Sheets

(51) Int. Cl.
*C23C 16/455* (2006.01)
*H01L 29/51* (2006.01)

(56) References Cited

U.S. PATENT DOCUMENTS

| | | | |
|---|---|---|---|
| 2004/0043634 A1* | 3/2004 | Vaartstra | C23C 16/40 |
| | | | 438/785 |
| 2006/0088962 A1 | 4/2006 | Herman et al. | |
| 2006/0141155 A1 | 6/2006 | Gordon et al. | |
| 2008/0029790 A1* | 2/2008 | Ahn | H01L 21/28255 |
| | | | 257/288 |
| 2008/0121184 A1* | 5/2008 | Choi | C23C 16/4401 |
| | | | 118/733 |
| 2010/0009080 A1* | 1/2010 | Jan Snijders | C23C 16/4481 |
| | | | 427/255.28 |
| 2010/0112211 A1 | 5/2010 | Xu et al. | |
| 2010/0168404 A1 | 7/2010 | Girolami et al. | |
| 2011/0183833 A1 | 7/2011 | Da Silva et al. | |

* cited by examiner

SOLID PRECURSOR DELIVERY SYSTEM

REFERENCE TO RELATED APPLICATION

The present application is a divisional application of U.S. application Ser. No. 14/092,362 filed on Nov. 27, 2013. The entire disclosures of the above applications are hereby incorporated by reference herein.

BACKGROUND

As the dimension of a semiconductor device is getting less, the gate structure and the thickness of the gate insulation layer are reduced accordingly. However, a leakage current occurs when the gate insulation layer of silicon oxide becomes thinner. To address the current leakage, high-k/metal gate (HK/MG) technology is used in semiconductor structure, adopting high-k material to replace silicon oxide, and metal gate to replace polysillicon gate accordingly. The HK/MG technology can facilitate the gate close/open rate and reduce current leaked from gate to body.

For the HK/MG technology, there are layers of films deposited on the metal gate, and good particle source control (i.e., solid source precursor of particle free) is required to avoid pits defect within metal gate during the deposition of the films. Any kind of particle source come from solid source precursor would easily impact performance of the semiconductor device.

To deposit films on the metal gate, atomic layer deposition (ALD) is used extensively. ALD is a process using precursor materials as a source to deposit the required film on a substrate, the precursor can be gas, liquid, or solid, and the precursor is transformed into its gas state for deposition. For instance, if a solid precursor is used, untransformed small particles from the solid precursor may fall on a semiconductor wafer center during carrier gas delivery and block the subsequent gate filling process within poly removal metal gate. Small particle is a strong blocking particle that would block the gate filling process and cause pits defect after chemical mechanical polishing (CMP), which affects the performance of the semiconductor device.

The above situation can be reduced by thermal caking, which uses heat to fuse particles of the solid precursor to become a cake of precursor in a container. However, the cake is still apt to crack and induce ultra-small particles during transportation of the container. In order to remove the ultra-small particles, it takes extra time to dump cracked solid precursor up to about one fifth of the solid precursor. Therefore, there is a need for a method to avoid the forming of small particles or ultra-small particles, and to facilitate the semiconductor fabrication.

BRIEF DESCRIPTION OF THE DRAWINGS

Embodiments of the present disclosure are best understood from the following detailed description when read with the accompanying figures. It is emphasized that, in accordance with the standard practice in the industry, various features are not drawn to scale. In fact, the dimensions of the various features may be arbitrarily increased or reduced for clarity of discussion.

DETAILED DESCRIPTION

It is to be understood that the following disclosure provides many different embodiments, or examples, for implementing different features of the invention. Specific examples of components and arrangements are described below to simplify the present disclosure. These are, of course, merely examples and are not intended to be limiting. Moreover, the formation of a first feature over or on a second feature in the description that follows may include embodiments in which the first and second features are formed in direct contact, and may also include embodiments in which additional features may be formed interposing the first and second features, such that the first and second features may not be in direct contact. Various features may be arbitrarily drawn in different scales for the sake of simplicity and clarity.

The singular forms "a," "an" and "the" used herein include plural referents unless the context clearly dictates otherwise. Therefore, reference to, for example, a metal gate includes embodiments having two or more such metal gates, unless the context clearly indicates otherwise. Reference throughout this specification to "one embodiment" or "an embodiment" means that a particular feature, structure, or characteristic described in connection with the embodiment is included in at least one embodiment of the present disclosure. Therefore, the appearances of the phrases "in one embodiment" or "in an embodiment" in various places throughout this specification are not necessarily all referring to the same embodiment. Further, the particular features, structures, or characteristics may be combined in any suitable manner in one or more embodiments. It should be appreciated that the following figures are not drawn to scale; rather, these figures are intended for illustration.

Figure 1:
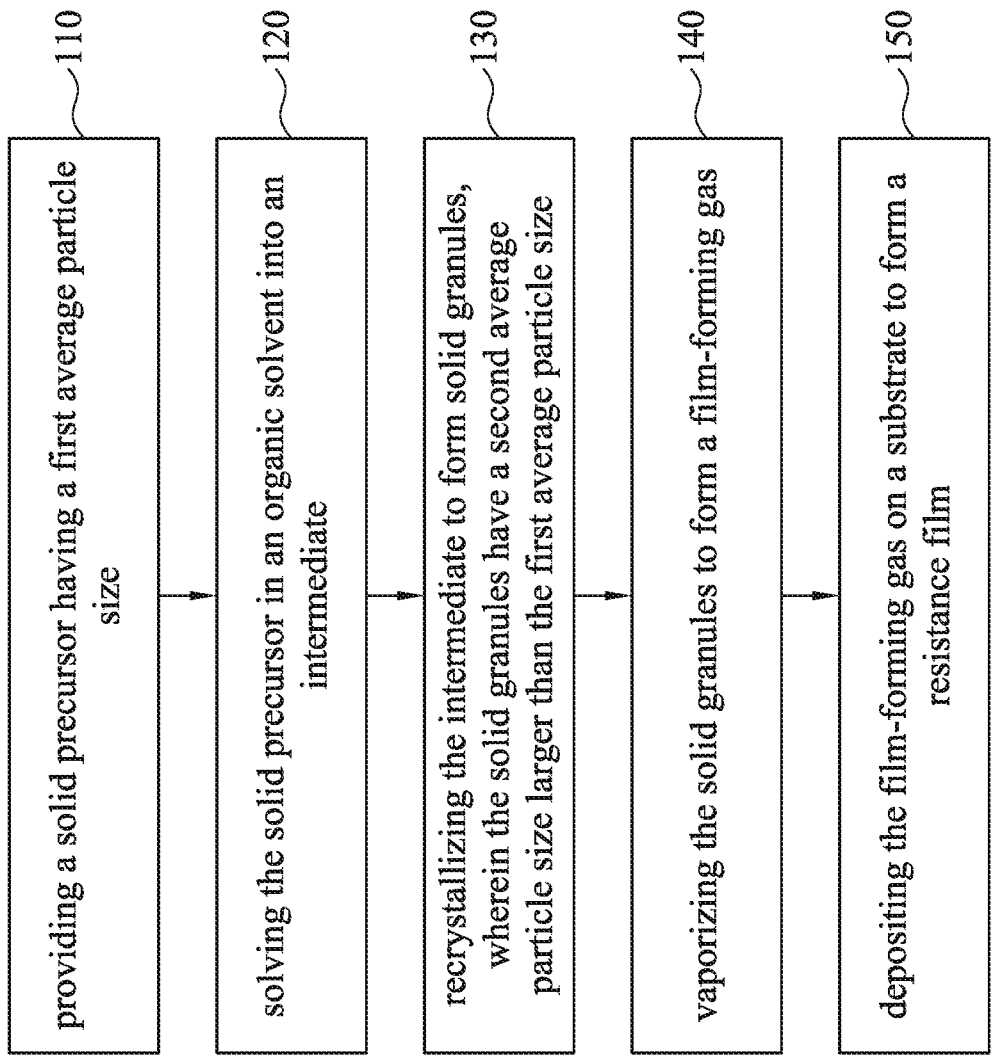
FIG. 1 is a flow chart illustrating a method for fabricating a semiconductor structure.

Referring to FIG. 1, a method for fabricating a semiconductor structure is illustrated in accordance with various embodiments of the present disclosure. In operation 110, a solid precursor having a first average particle size is provided. In one embodiment, the first average particle size is in the range of 300 μm to 500 μm.

In operation 120, the solid precursor is solved in an organic solvent to form an intermediate.

In operation 130, the intermediate is recrystallized to form solid granules, and the solid granules have a second average particle size larger than the first average particle size. Recrystallizing the intermediate may be performed at a temperature in the range of −30° C. to 10° C. In one embodiment, the second average particle size is in the range of 1 mm to 10 mm. In another embodiment, the purity of the solid source after recrystallization is greater than 99.999%, while the purity of the solid source is about 99.99% in exiting methods.

Still referring to FIG. 1, in operation 140, the solid granules are vaporized to form a film-forming gas, and in operation 150, the film-forming gas is deposited on a substrate to form a resistance film. In one embodiment, the substrate is a semiconductor wafer. In another embodiment, the substrate is a metal gate.

Figure 2:
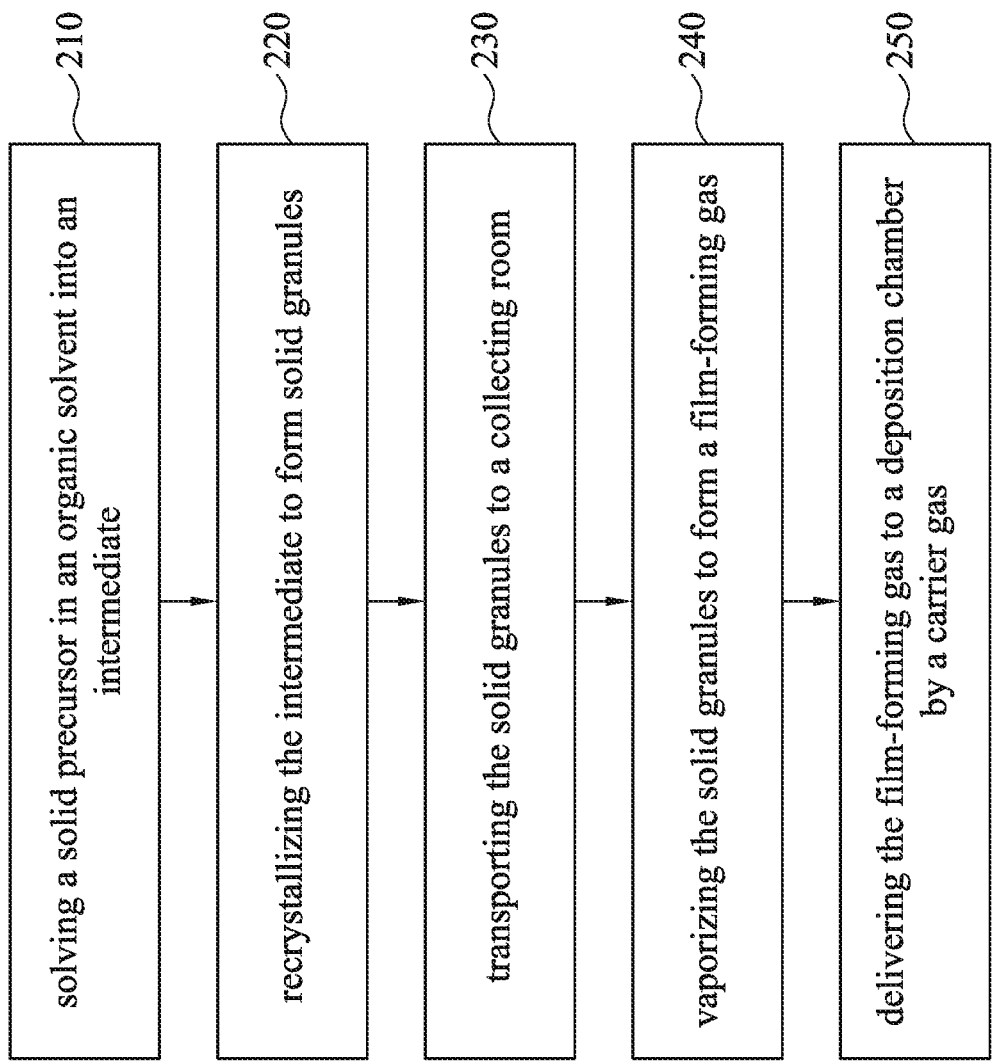
FIG. 2 is a flow chart illustrating a method for modifying a resistance film source in a semiconductor fabrication.

Referring to FIG. 2, a method for modifying a resistance film source in a semiconductor fabrication is illustrated in accordance with various embodiments of the present disclosure. In one embodiment, the semiconductor fabrication is an atomic layer deposition process, and the atomic layer deposition process may be applied in high-k metal gate technology.

In operation 210, a solid precursor is solved in an organic solvent to form an intermediate. In operation 220, the intermediate is recrystallized to form solid granules, and the recrystallization may be performed at a temperature in the range of −30° C. to 10° C.

In operation 230, the solid granules are transported to a collecting room. Then, in operation 240, the solid granules are vaporized to form a film-forming gas. The solid granules may be vaporized by heating the collecting room to a temperature above the melting point of the solid granules.

Still referring to FIG. 2, in operation 250, the film-forming gas is delivered to a deposition chamber by a carrier gas. In one embodiment, the carrier gas is an inert gas. In another embodiment, the carrier gas is argon.

Figure 3:
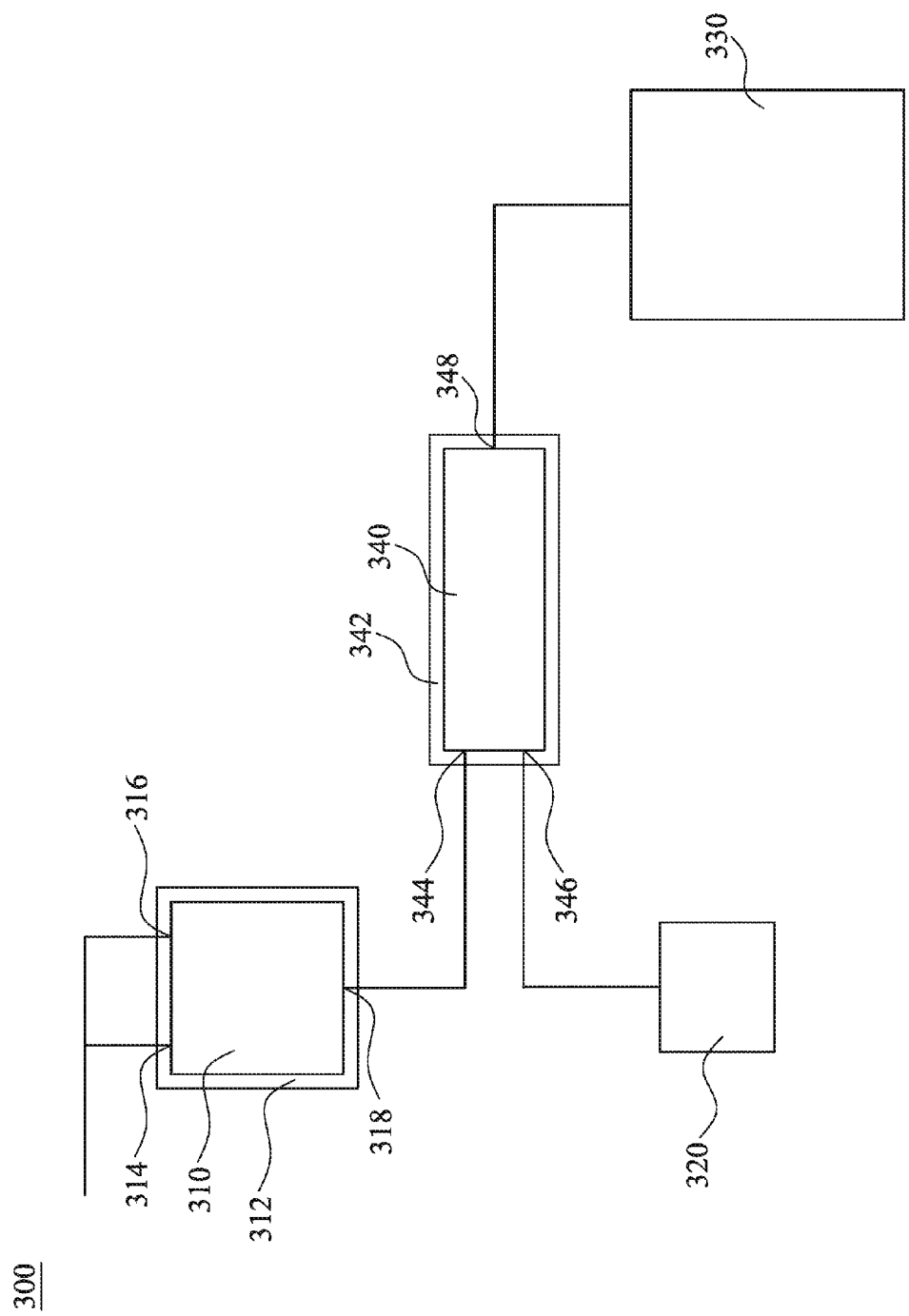
FIG. 3 is a solid precursor delivery system for a semiconductor fabrication in accordance with one embodiment in the present disclosure.

FIG. 3 is a solid precursor delivery system 300 for a semiconductor fabrication in accordance with one embodiment in the present disclosure. The solid precursor delivery system 300 included a recrystallizing reservoir 310, a gas tank 320, a deposition chamber 330, and a collecting room 340. The recrystallization reservoir 310 includes cooling elements 312 around the recrystallization reservoir 310, a precursor entry port 314, a solvent entry port 316, and a granule exit port 318. A solid precursor and an organic solvent (not shown) are provided to the recrystallization reservoir 310 through the precursor entry port 314 and the solvent entry port 316 respectively, and the solid precursor is solved into an intermediate. Then, the recrystallization reservoir 310 is cooled by the cooling elements 312 to recrystallize the intermediate and form solid granules. After recrystallization, the solid granules are transported to the collecting room 340 through the granule exit port 318.

The solid precursor may be Pentakis-dimethylamino tantalum (PDMAT), tantalum chloride ($TaCl_5$), tantalum fluoride ($TaF_5$), hafnium chloride ($HfCl_4$), niobium fluoride ($NbF_5$), or molybdenum fluoride ($MoF_5$), and the organic solvent may be pentane, hexane, cyclopentane, or cyclohexane.

Still referring to FIG. 3, the collecting room 340 includes heating elements 342 around the collecting room 340, a granule entry port 344 connecting to the granule exit port 318, a gas entry port 346 connecting to the gas tank 320, and a gas exit port 348 connecting to the deposition chamber 330. After the solid granules were transported to the collecting room 340 through the granule entry port 344, the collecting room 340 is heated to a temperature above the melting point of the solid granules by the heating element 342 to vaporize the solid granules and form a film-forming gas. Then, the carrier gas in the gas tank 320 enters the collecting room 340 through the gas entry port 346, and exits through the gas exit port 348 carrying the film-forming gas to deliver the film-forming gas to the deposition chamber 330. In one embodiment, the gas tank 320 is an inert gas tank. In another embodiment, the gas tank 320 is an argon gas tank.

After the film-forming gas was delivered to the deposition chamber 330, the film-forming gas deposits in the deposition chamber 330 to form a resistance film on a substrate. The deposition chamber 330 may be an atomic layer deposition chamber, and the atomic layer deposition chamber may be applied in high-k metal gate technology.

Figure 4:
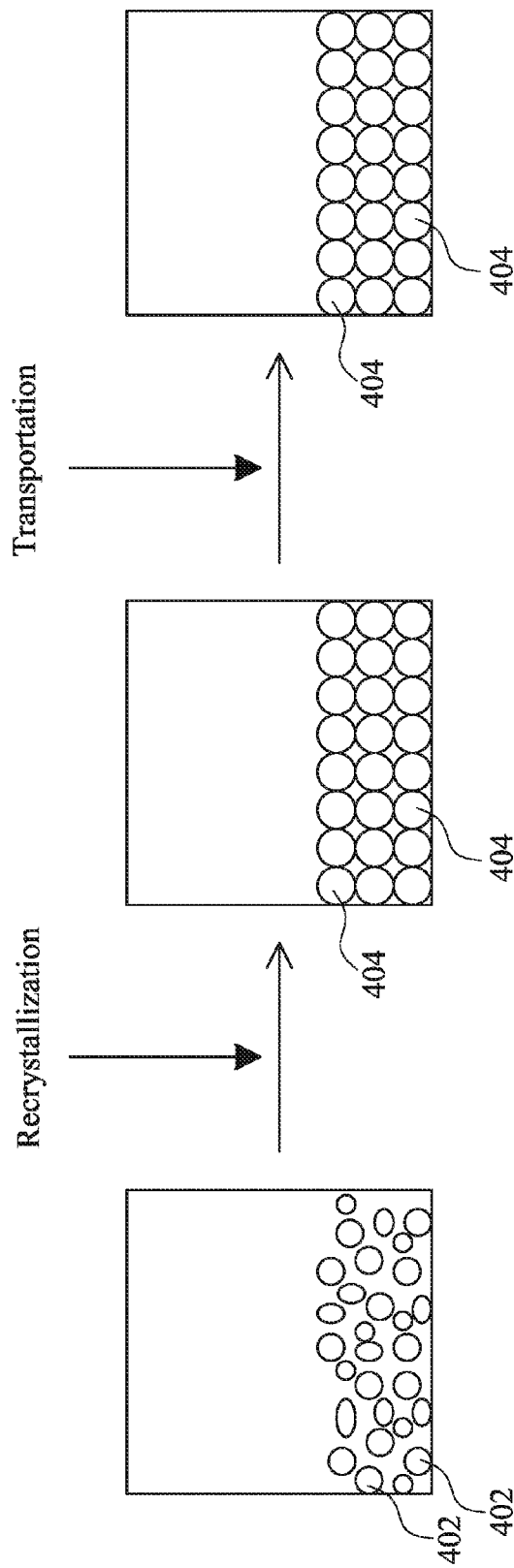
FIG. 4 illustrates changes in particle size of a solid precursor and solid granules.

FIG. 4 illustrates changes in particle size of a solid precursor 402 and solid granules 404 in accordance with various embodiments of the present disclosure. Referring to FIG. 3 and FIG. 4, a solid precursor 402 has a first average particle size, and after recrystallizing in the recrystallization reservoir 310, the solid precursor 402 becomes solid granules 404 having a second average particle size larger than the first average particle size, which the first average particle size is in the range of 300 µm to 500 µm, and the second average particle size is in the range of 1 mm to 10 mm. The solid granules 404 keeps stable during transportation, and there is no small particles or ultra-small particles formed. Thus, the gate would not be blocked by particles and there would be no need to take extra time to dump cracked solid precursor, which are advantages and problems solved of the present disclosure.

It is noteworthy that the transportation mentioned above may be transporting the recrystallization reservoir 310 with solid granules 404 inside, transporting the collecting room 340 with solid granules 404 inside, or transporting the solid granules 404 from the recrystallization reservoir 310 to the collecting room 340.

The embodiments of the present disclosure discussed above have advantages over exiting methods and systems. Because of the recrystallization of the solid precursor prior to deposition, small particles or ultra-small particles from solid precursor can be removed, and the purity of the solid source can be improved. The method for fabricating a semiconductor structure in the present disclosure does not need extra time to dump cracked solid precursor, which saves time and raw materials. It is understood, however, that other embodiments may have different advantages, and that no particular advantages is required for all embodiments.

The foregoing has outlined features of several embodiments so that those skilled in the art may better understand the detailed description that follows. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions and alterations herein without departing from the spirit and scope of the present disclosure.

What is claimed is:

1. A solid precursor delivery system for a semiconductor fabrication, comprising:
   a recrystallization reservoir, comprising:
      cooling elements around the recrystallization reservoir;
      a precursor entry port, wherein a solid precursor is configured to enter the recrystallization reservoir through the precursor entry port;
      a solvent entry port, wherein an organic solvent enters the recrystallization reservoir through the solvent entry port; and
      a granule exit port;
   a gas tank;
   a deposition chamber; and
   a collecting room, comprising:
      heating elements around the collecting room;
      a granule entry port connecting to the granule exit port;
      a gas entry port connecting to the gas tank; and
      a gas exit port connecting to the deposition chamber.

2. The system of claim 1, wherein the solid precursor is Pentakis-dimethylamino tantalum (PDMAT), tantalum chloride ($TaCl_5$), tantalum fluoride ($TaF_5$), hafnium chloride ($HfCl_4$), niobium fluoride ($NbF_5$), or molybdenum fluoride ($MoF_5$).

3. The system of claim 1, wherein the organic solvent is pentane, hexane, cyclopentane, or cyclohexane.

4. The system of claim 1, wherein the gas tank is an inert gas tank.

5. The system of claim 4, wherein the gas tank is an argon gas tank.

6. The system of claim 1, wherein the deposition chamber is an atomic layer deposition chamber.

7. The system of claim 6, wherein the atomic layer deposition chamber is applied in high-k metal gate technology.

8. The system of claim 1, wherein a carrier gas is configured to enter the collecting room from the gas tank through the gas entry port.

9. The system of claim 8, wherein the carrier gas exits the collecting room through the gas exit port.

10. The system of claim 9, wherein the carrier gas through the gas exit port carries a film-forming gas to the deposition chamber.

11. The system of claim 2, wherein the solid precursor becomes solid granules after recrystallization in the recrystallization reservoir.

12. The system of claim 11, wherein the solid granules have a second average particle size larger than a first average particle size of the solid precursor.

13. The system of claim 12, wherein the first average particle size ranges from 300 µm to 500 µm.

14. The system of claim 12, wherein the second average particle size ranges from 1 mm to 10 mm.

15. The system of claim 11, wherein the recrystallization is performed at a temperature in the range of −30° C. to 10° C.

16. The system of claim 11, wherein the recrystallization reservoir is transportable with the solid granules inside.

17. The system of claim 11, wherein the collecting room is transportable with the solid granules inside.

18. The system of claim 11, wherein the solid granules are transported from the recrystallization reservoir to the collecting room.

19. The system of claim 18, wherein the solid granules are transported through the granule entry port.

20. The system of claim 18, wherein the solid granules keep stable during the transportation in particle size.

* * * * *